(12) United States Patent
Ohtsuka

(10) Patent No.: US 6,462,531 B1
(45) Date of Patent: Oct. 8, 2002

(54) CURRENT DETECTOR HAVING A HALL-EFFECT DEVICE

(75) Inventor: Koji Ohtsuka, Kawagoe (JP)

(73) Assignee: Sanken Electric Co., Ltd. (JP)

( * ) Notice: Subject to any disclaimer, the term of this patent is extended or adjusted under 35 U.S.C. 154(b) by 5 days.

(21) Appl. No.: 09/713,996

(22) Filed: Nov. 16, 2000

(30) Foreign Application Priority Data

Dec. 9, 1999 (JP) ............................................. 11-350063

(51) Int. Cl.$^7$ .............................................. G01R 33/00
(52) U.S. Cl. ................................................... 324/117 H
(58) Field of Search ........................... 324/117 H, 225, 324/244, 251; 327/362, 510, 511, 512, 560, 561, 562; 257/426, 427

(56) References Cited

U.S. PATENT DOCUMENTS

| | | | | |
|---|---|---|---|---|
| 4,123,772 A | * | 10/1978 | Janssen | 357/27 |
| 5,260,614 A | * | 11/1993 | Theus et al. | 307/491 |
| 5,426,364 A | * | 6/1995 | Yi | 324/251 |
| 5,604,433 A | * | 2/1997 | Theus et al. | 324/251 |
| 5,640,085 A | * | 6/1997 | Petr et al. | 324/105 |
| 6,232,832 B1 | * | 5/2001 | Kirkpatrick | 327/560 |

FOREIGN PATENT DOCUMENTS

| | | |
|---|---|---|
| JP | 53-7183 | 1/1978 |
| JP | 4-364472 | 12/1992 |
| JP | 10-282156 | 10/1998 |
| JP | 10-293141 | 11/1998 |

* cited by examiner

*Primary Examiner*—N. Le
*Assistant Examiner*—Etienne P LeRoux
(74) *Attorney, Agent, or Firm*—Woodcock Washburn LLP

(57) ABSTRACT

A current detector having a Hall-effect device formed in a semiconductor substrate for giving an output voltage proportional to the magnitude of an electric current. The detector has a first and a second current path terminal for the flow of the current to be detected. The two current path terminals are interconnected via two current paths having resistance values such that the current is divided at a prescribed ratio into two fractions on flowing into the current paths. While one current path directly interconnects the two terminals, the other path includes a conductor layer formed on the semiconductor substrate via an insulating layer so as to extend around the Hall-effect device. The magnitude of the complete current is detectable by the Hall-effect device from the current fraction flowing through the conductor layer. All but the terminals of the current detector is encapsulated to reduce a temperature difference between the two current paths to a minimum.

12 Claims, 7 Drawing Sheets

CURRENT DETECTOR HAVING A HALL-EFFECT DEVICE

BACKGROUND OF THE INVENTION

This invention relates to current detectors, particularly to that utilizing a Hall-effect device for obtaining a voltage proportional to the magnitude of the current detected.

By the term "Hall-effect device" used herein and in the claims appended hereto is meant the voltage generator built on the familiar Hall effect to give an output voltage in direct proportion to the magnetic field applied. Disposed on a current path, the Hall-effect device will be subjected to the magnetic field that is generated in proportion to the magnitude of the current flowing through the path. The result will be the production of a voltage proportional to the current magnitude.

The instant applicant proposed in U.S. patent application Ser. No. 09/555,361, filed May 30, 2000, to create an insulating film over a Hall-effect device formed in a semiconductor substrate and, on this insulating film, a conductor layer for carrying a current to be detected. The current path is thus situated as close as feasible to the Hall-effect device, resulting in enhancement of the current-detecting sensitivity.

This prior art current detector proved to be unsatisfactory, however, in the magnitude of the current that can be carried by the conductor ductor layer. A current of, say, one hundred amperes or more could not possibly be made to flow through it.

The applicant attempted to defeat this shortcoming of the prior art device by developing a current detector in which two printed-on current paths are formed on a circuit board, one of them being electrically connected to a Hall-effect device. The magnitude of the current flowing through the other current path is detectable from that of the current flowing through the one current path, only if the resistance values of both current paths are known. Variations in the current magnitude are likewise detectable.

This improved prior art device has proved to have its own weakness: The two current paths must of necessity be so spaced from each other that an inconveniently great temperature difference tends to occur therebetween. Such a temperature difference is undesirable because it can bring about fluctuations in the ratio at which the current is divided between the two paths, with the consequent deterioration of the accuracy of current detection.

SUMMARY OF THE INVENTION

The present invention aims at the provision of a current detector of the type incorporating a Hall-effect device, that is capable of more accurately detecting a current of greater magnitude than heretofore.

Briefly, the current detector according to the invention comprises a Hall-effect device for generating a voltage proportional to magnetic field strength, a first and a second current path terminal for the flow of a current to be detected or measured, and first and second conductor means connected between the first and the second current path terminal for providing a first and a second current path, respectively, therebetween. The first and the second conductor means have their resistances predetermined in relation to each other so that the current on the first current path terminal is divided at a predetermined ratio into a first fraction flowing through the first conductor means to the second current path terminal, and a second fraction flowing through the second conductor means to the second current path terminal. A conductor included in the second conductor means is so arranged in relation to the Hall-effect device as to cause the same to generate an output voltage proportional to the magnitude of the second fraction of the current flowing through the conductor, and hence to the magnitude of the complete current on the first current path terminal. Also included is an enclosure of electrically insulating material closely enveloping at least the first and the second conductor means.

The complete current detector is encapsulated in a preferred embodiment to be set forth subsequently, leaving exposed only parts of the current path terminals and other necessary terminals. The encapsulation conduces to reduction of a temperature difference between the first and the second conductor means to a minimum. The reduction of the temperature difference serves in turn to assure that the current is infallibly divided into the two fractions exactly at the predetermined ratio, such division being essential for accurate measurement of the current magnitude.

Another advantage of the encapsulation is the mechanical integration of the current paths and the Hall-effect device. The enhanced positional stability of these components is believed to diminish errors in current detection. Moreover, only partly projecting from the encapsulation, the current path terminals will be connected to an external circuit whose current is to be detected, in a manner that will not affect the accuracy of current detection or measurement.

The Hall-effect device may be conventionally formed in a semiconductor substrate having a main wording region where a voltage is generated in response to a magnetic field due to the flow of the second fraction of the current through the conductor of the second conductor means. Preferably, in this case, the conductor of the second conductor means may be formed in the shape of a substantially annular strip on the semiconductor substrate via an Insulating layer so as to encircle, as seen from above, the main working region of the Hall-effect device. The conductor can thus be situated as close as possible to the Hall-effect device and in a manner conductive to higher detection sensitivity.

The above and other objects, features and advantages of the invention and the manner of realizing them will become more apparent, and the invention itself will best be understood, from the following description taken together with the attached drawings showing the preferred embodiments of the invention.

DESCRIPTION OF THE PREFERRED EMBODIMENTS

Figure 1:
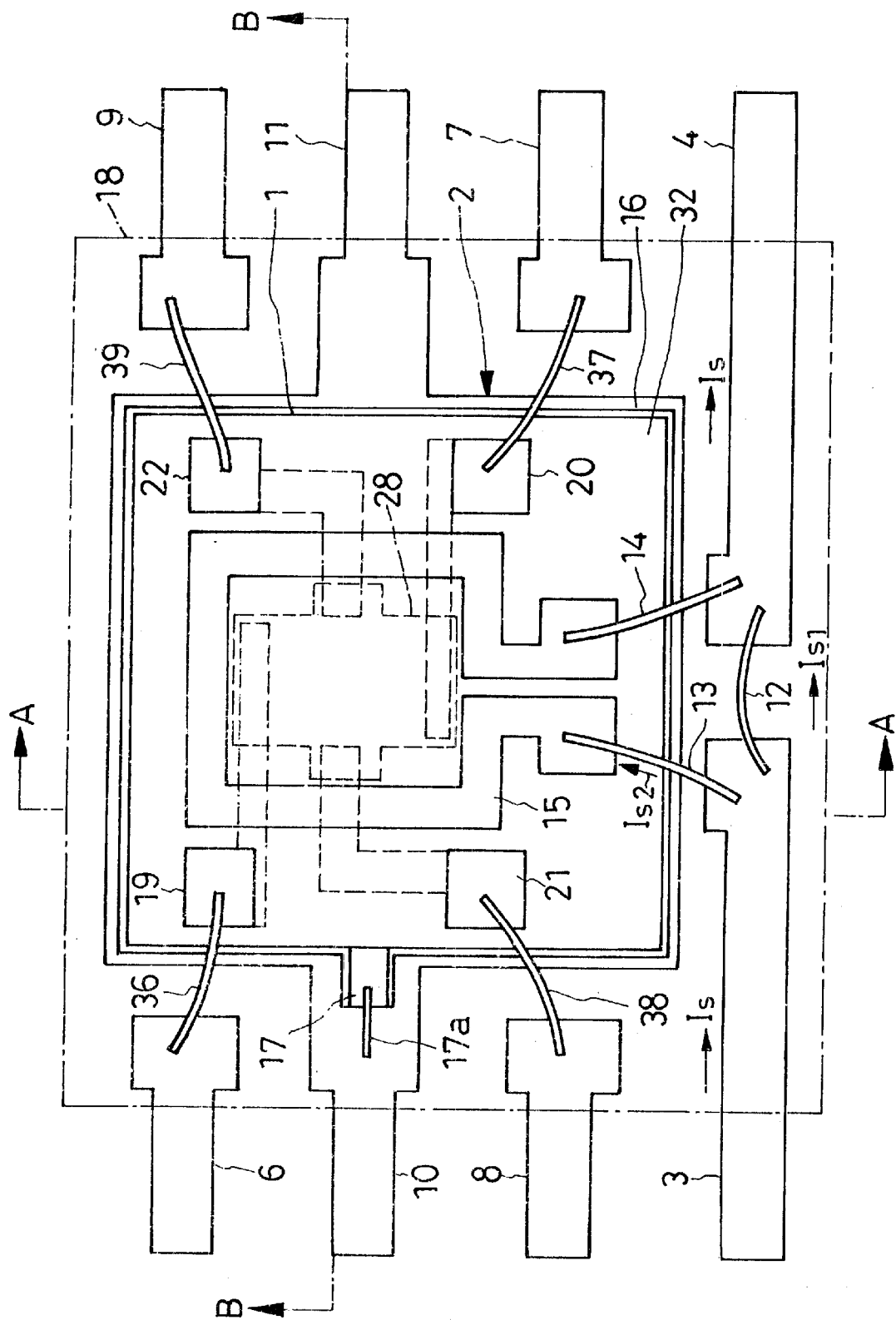
FIG. 1 is a plan view of the current detector embodying the principles of the instant invention, the view showing the encapsulation in phantom outline to reveal other parts.
Figure 2:
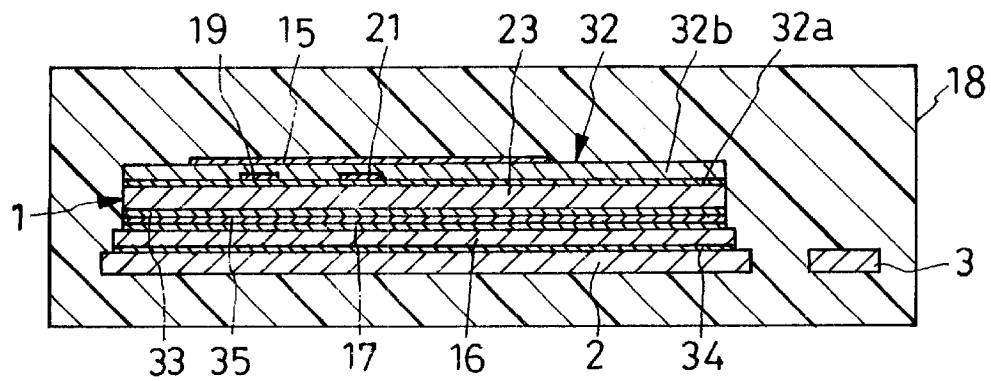
FIG. 2 is a section through the current detector, taken along the line A—A in FIG. 1.

The general organization of the first preferred form of current detector according to the invention will become apparent from a study of FIG. 1 and 2. The current detector comprises: (a) a Hall-effect device 1 for providing an output voltage indicative of the magnitude of the current Is to be detected or measured, (b) a metal-made baseplate 2; (c) two current path terminals 3 and 4 for carrying the current Is; (d) four lead terminals 6, 7, 8 and 9 for connection of the Hall-effect device 1 to external circuitry; (e) two other terminals 10 and 11 for grounding the baseplate 2; (f) a wire or like conductor 12 bridging the current path terminals 3 and 4 for providing therebetween a first current path for carrying a first division $Is_1$ of the current Is; (g) two other wires or like conductors 13 and 14 and a conductor layer 15 conjointly providing a second current path between the current path terminals 3 and 4 for carrying a second division $Is_2$ of the current Is; (h) an insulating plate 16; (i) a shielding layer 17; and (j) a plastic envelope 18 in which the current detector is closely encapsulated, leaving exposed only parts of the noted terminals 3, 4 and 6–11.

Figure 3:
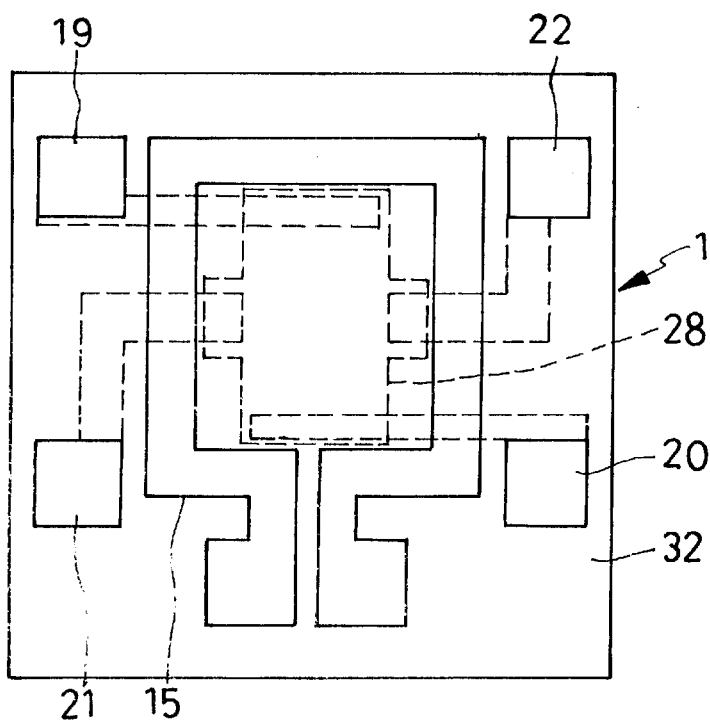
FIG. 3 is a plan view of the Hall-effect device included in the FIG. 1 current detector.

As seen in a plan view as in FIGS. 1 and 3, the Hall-effect device is approximately square in shape, having four electrodes 19, 20, 21 and 22 formed adjacent its corners. A consideration of both FIGS. 1 and 7 in particular will reveal that the electrodes 19–22 are electrically connected respectively to the four semiconductor regions 24, 25, 26 and 27 of a semiconductor substrate 23. In use of this. device the electrodes 19 and 20 are to be connected to a control current supply circuit, not shown, of well known construction, and the electrodes 21 and 22 to an amplifier, also not shown.

Figure 7:
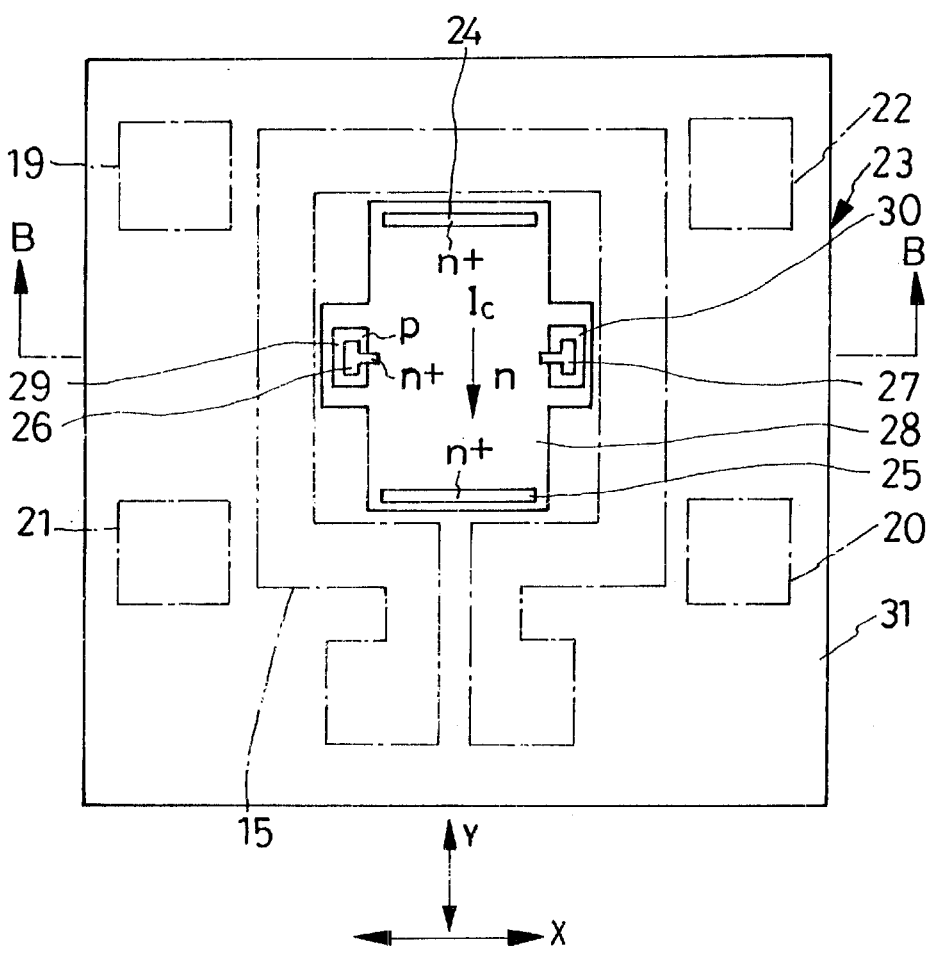
FIG. 7 is a plan view showing the semiconductor substrate of the FIG. 1 current detector on a slightly enlarged scale.

Generally in the shape of a rectangular sheet of silicon, the semiconductor substrate 23 has four other semiconductor regions 28, 29, 30 and 31 than the aforesaid four semiconductor regions 24–27, as best shown also in FIG. 7. Of n conductivity type, the fifth semiconductor region 28 takes the form of an island of cruciate shape, as seen in a plan view as in this figure, in the middle of the p type eighth semiconductor region 31 which occupies most part of the semiconductor substrate 23.

The first and second semiconductor regions 24 and 25 are of $n^+$ type, higher in impurity concentration than the fifth semiconductor region 28, and are formed as islands, spaced from each other along the y axis in FIG. 7, in the fifth semiconductor region 28. The first and second electrodes 19 and 20 are in ohmic contact with these semiconductor regions 24 and 25. When the unshown control current supply circuit is connected to the electrodes 19 and 20, the control current $I_c$ is to flow through the fifth semiconductor region 28, either from first 24 to second 25 semiconductor region or the other way around.

Of $n^+$ type, with an impurity concentration higher than that of the fifth semiconductor region 28, the third and fourth semiconductor regions 26 and 27 lie approximately centrally of the fifth semiconductor region 28 in the direction of the y axis, with a spacing from each other in the direction of the x axis. The semiconductor regions 26 and 27 are partly contiguous to the fifth semiconductor region 28, partly to the p type sixth and seventh semiconductor regions 29 and 30, and are in ohmic contact with the third and fourth electrodes 21 and 22. The semiconductor regions 29 and 30 are intended to limit the areas of contact of the semiconductor regions 26 and 27 with the semiconductor region 28. The semiconductor regions 26 and 27 function to detect the output voltage of the Hall-effect device 1.

The Hall voltage is to be obtained between the third and fourth semiconductor regions 26 and 27 when the control current $I_c$ is made to flow between the semiconductor regions 24 and 25, with a magnetic field perpendicular to the direction of current flow. Therefore, the term "primary operating part" of the Hall-effect device, as used herein and in the claims appended hereto, may be construed as that part of the fifth semiconductor region 28 which lies between the semiconductor regions 24 and 25 and between the semiconductor regions 26 and 27. More broadly, however, the entire semiconductor region 28 may be considered to constitute the primary operating part of the Hall-effect device.

As indicated in FIG. 2, the semiconductor substrate 23 has a laminar insulation 32 of silicon oxides or the like formed on its top surface, as seen in this figure, and a layer 33 of aluminum or like metal formed on its bottom surface, although the provision of this metal layer is not of absolute necessity. The laminar insulation 32 is shown to be composed of two layers or laminae 32a and 32b in this embodiment of the invention.

As will be understood from an inspection of both FIGS. 1 and 2, the four electrodes 19–22, typically of aluminum, have parts sandwiched between the insulating layers 32a and 32b. The ends of these parts contact the semiconductor regions 24–27 through windows in the insulating layer 32a The other ends of the electrodes 19–22 are exposed through windows in the other insulating layer 32b. The noted conductor layer 15, providing part of the second current path, overlies the insulating layer 32b.

Figure 5:
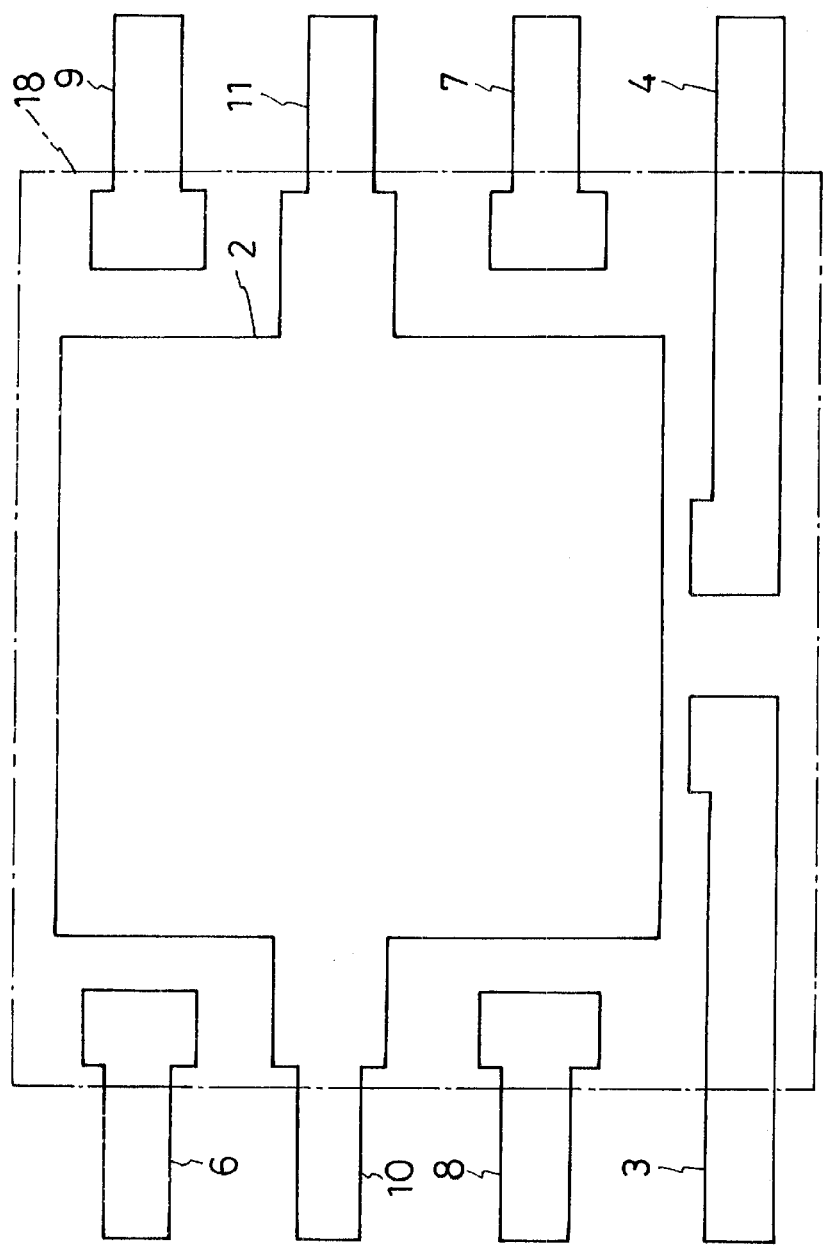
FIG. 5 is a plan view showing the sheet-metal baseplate, pair of current-path terminals, and other terminals of the FIG. 1 current detector in their relative positions.

FIG. 5 best indicates that the metal-made baseplate 2 is approximately square in shape and, as clearly revealed in FIG. 2, somewhat larger in size than the Hall-effect device 1. The baseplate 2 is designed to serve not only as mechanical support for the Hall-effect device 1 but as heat radiator and, further, as electrostatic shield. For successful fulfillment of all such intended functions the baseplate 2 may be fabricated from sheet copper of 0.5 to 1.0 millimeter in thickness with a nickel plating thereon.

The two terminals 10 and 11 extend from the pair of opposite edges of the baseplate 2 for grounding. The current path terminals 3 and 4 extend along one of the other two opposite edges of the baseplate 2, with spacings therefrom and a spacing from each other. The terminals 6–9 for connection of the Hall-effect device to external circuitry are also spaced from the baseplate 2. Mechanically, however, the Hall-effect device 1 and the terminals 3, 4, 6–11 are all firmly interconnected by the plastic encapsulation 18, indicated by the broken lines in FIG. 5, closely enveloping them.

Figure 6:
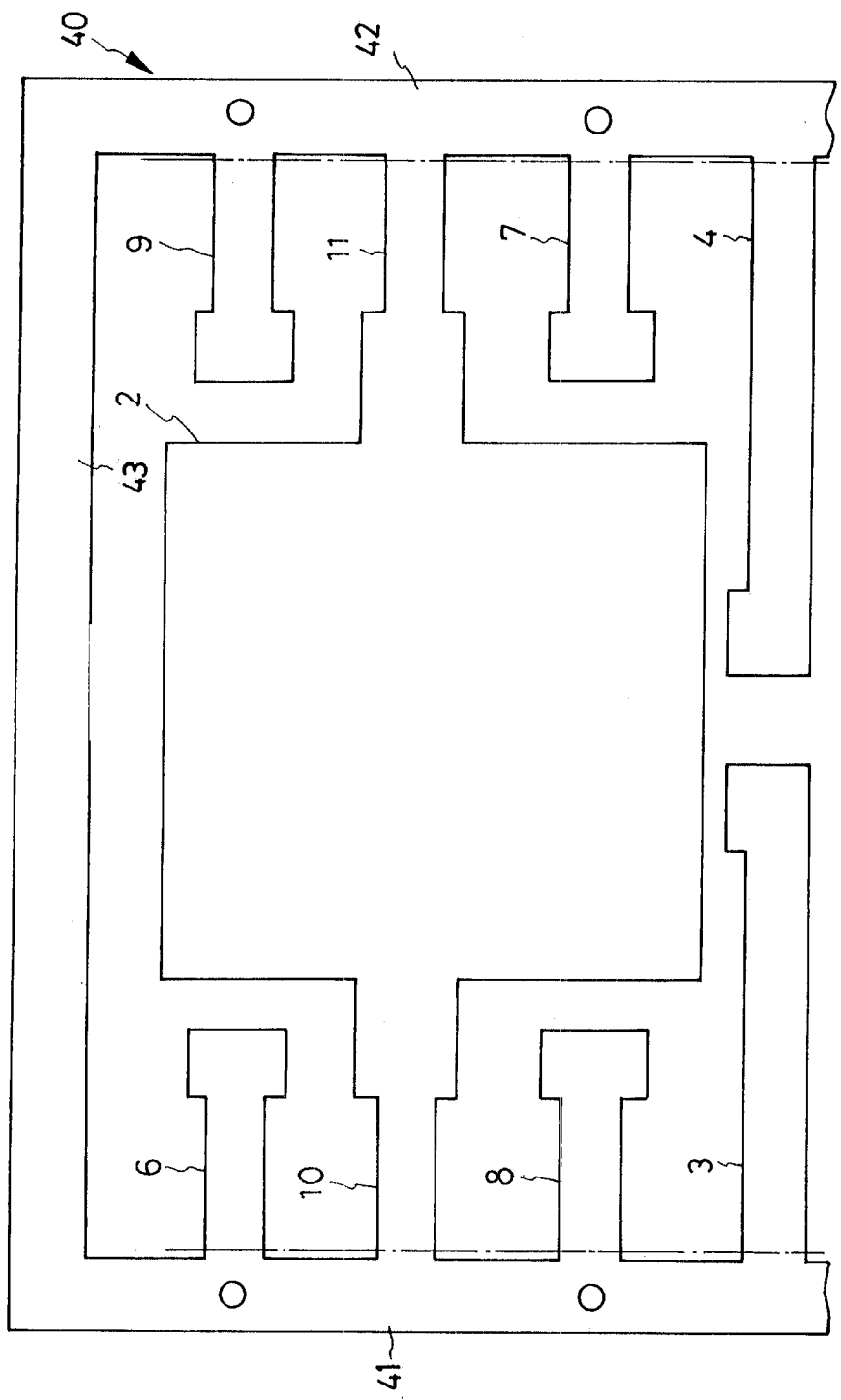
FIG. 6 is a plan view of a sheet-metal punching for use in the fabrication of the baseplate and terminals shown in FIG. 5.

The baseplate 2 and the terminals 3–11 can all be fabricated from a sheet-metal punching shown FIG. 6 and therein generally designated 40. The punching 40 has a frame portion 41 holding the terminals 3, 6, 8 and 10 in their prescribed relative positions, another frame portion 42 likewise holding the terminals 4, 7, 9 and 11, and still another bridge portion 43 interconnecting the foregoing two bridge portions 41 and 42. All the terminals 3, 4 and 6–11 are to be cut off the frame portions 41 and 42 along the dot-and-dash lines after the complete device has been encapsulated. Although FIG. 6 shows a punching portion for the set of terminals of one Hall-effect device, it is understood that in practice a punching is fabricated for the terminals of many such devices.

Figure 4:
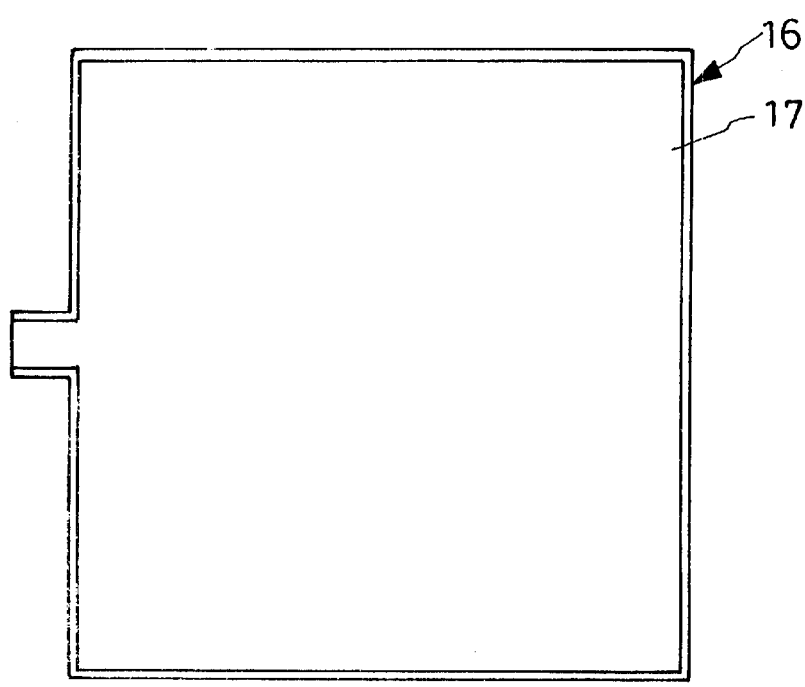
FIG. 4 is a plan view of an insulating plate, together with a shielding layer thereon, included in the FIG. 1 current detector.

The insulating plate 16, FIGS. 1, 2 and 4, is an approximately square piece of sheet ceramic, among other insulating materials, which is slightly larger in size than the Hall-effect device 1. Overlying the baseplate 2 as in FIG. 2, the insulating plate 16 functions to insulate the Hall-effect device 1 from the baseplate and to mechanically support the device.

Directly overlying the insulating plate 16, the shielding layer 17 is a sheet of magnetic material of approximately the same shape and size therewith. Preferred magnetic materials are iron, nickel, cobalt, and like conductors capable of shielding the Hall-effect device from the influence of external electric and magnetic fields. Alternatively, the shielding layer 17 may be a lamination of a conductive and a magnetic layer, or it may be made from a nonmagnetic conductor such as copper or from a magnetic insulator such as ferrite. The shielding layer 17 is electrically connected to the lead terminal 10 via a wire 17a as in FIG. 1. In addition to magnetically shielding the Hall-effect device 1, this layer is intended to serve to diminish the magnetic resistance of the path of the magnetic flux created by current flow through the conductor layer 15 forming a major part of the second current path.

Figure 8:
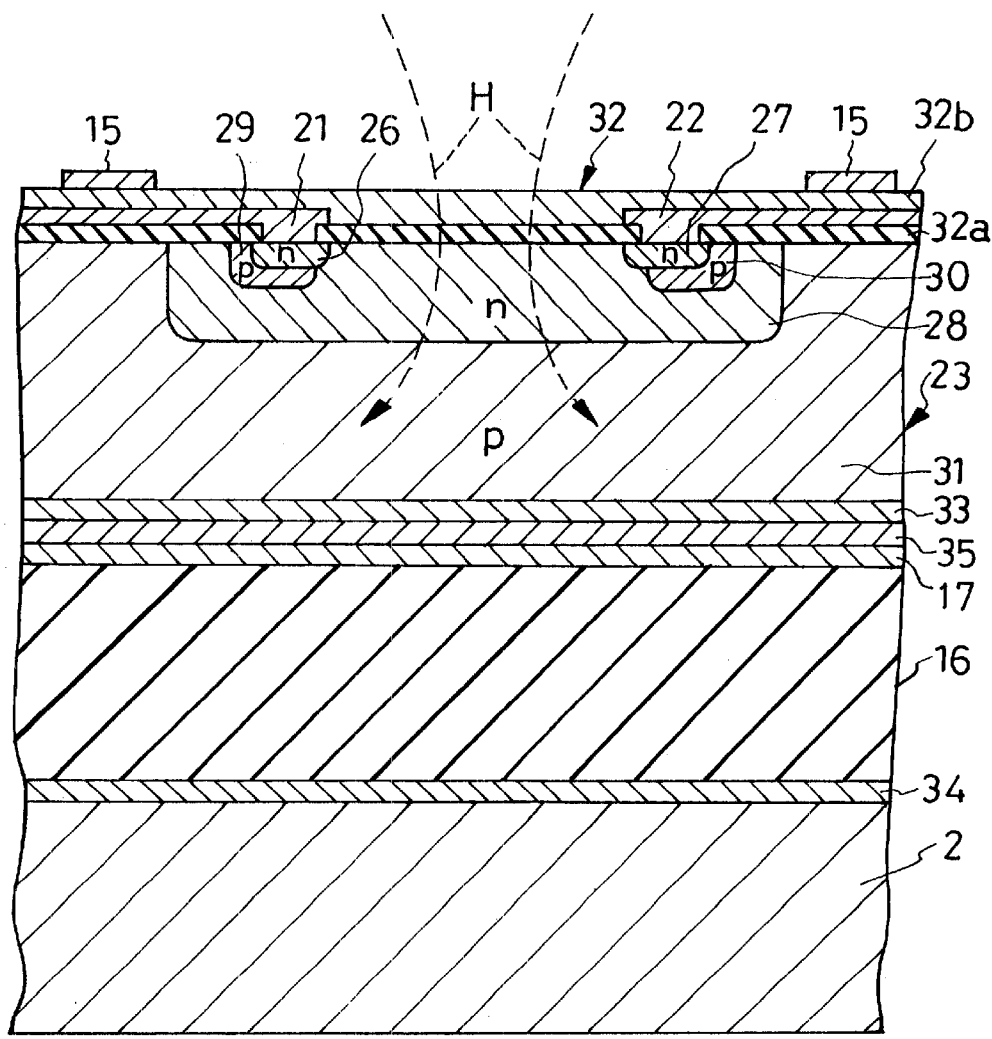
FIG. 8 is an enlarged, fragmentary section through the Hall-effect device of the FIG. 1 current detector, taken along the line B—B therein.

A consideration of FIGS. 2 and 8 will show that the insulating plate 16 with the shielding layer 17 thereon is bonded to the baseplate 2 via an adhesive layer 34. The noted metal layer 33 bounding the bottom of the Hall-effect device 1 is secured to the shielding layer 17 via a layer 35 of solder or like conductive bonding agent.

With reference back to FIG. 1 the electrodes 19–22 of the Hall-effect device 1 are electrically connected as aforesaid to the four semiconductor regions 24–27, respectively, of the semiconductor substrate 23 on the one hand and, on the other hand, to the lead terminals 6–9 via wires 36–39, respectively. Typically made from aluminum, the wire 12 interconnecting the current path terminals 3 and 4 is for formation of the first, direct current path from terminal 3 to terminal 4. This first current path is to carry the first division $Is_1$ of the current Is to be detected or measured, as that current is divided into $Is_1$ and $Is_2$ at the end of the terminal 3. A description of the second, indirect current path from terminal 3 to terminal 4, for carrying the second current division $Is_2$, follows.

As seen in FIGS. 1, 3, 7 and 8, the conductor layer 15 of aluminum or the like is formed on the insulating layers 32 so as to surround, as seen in a plan view, the semiconductor region 28, the broader main working region of the Hall-effect device 1. The conductor layer 15 so encircles approximately ninety-five percent of the periphery of the semiconductor region 28 in this particular embodiment. Speaking more broadly, however, the conductor layer 15 should so encircle not less than approximately three quarters of the Hall-effect device 1 in order to make this device sufficiently sensitive to the magnetic field that is generated with the flow of the second current division $Is_2$ through the conductor layer 15, as will be detailed subsequently.

The conductor layer 15 has one extremity thereof coupled to the first current path terminal 3 via the aluminum wire 13, and the other extremity thereof coupled to the second current path terminal 4 via the aluminum wire 14, thereby completing the second current path, in parallel with the first current path, for carrying the second current division $Is_2$ from terminal 3 to terminal 4 via the Hall-effect device 1. So arranged and electrically connected to the current path terminals 3 and 4, the conductor layer 15 is designed to apply to the Hall-effect device 1 the magnetic flux due to the flow of the second current division $Is_2$ therethrough.

Let us assume that the resistances of the two current path terminals 3 and 4 are negligibly small. The currents $Is_1$ and $Is_2$ divided between the two current paths are defined as:

$$Is_1 = Is[R_2/(R_1+R_2)]$$

$$Is_2 = Is[R_1/(R_1+R_2)]$$

where $R_1$=the resistance of the wire 12 throughout its length, $R_2$=the resistance of the total length of the wire 13, the conductor layer 15 and the wire 14.

For detection or measurement of the current Is flowing through some electric circuit under measurement, by the current detector of the above described construction, the current path terminals 3 and 4 may be serially connected to the desired electric circuit. Further the lead terminals 6 and 7 may be connected to the unshown control current supply circuit for causing the control current Ic, FIG. 7, to flow between the semiconductor regions 24 and 25, and the lead terminals 8 and 9 to the unshown amplifier.

Flowing into the current detector from the current path terminal 3, the current Is to be measured will be divided into $Is_1$ and $Is_2$. The first division $Is_1$ will flow from terminal 3 to terminal 4 by way of the wire 12, the first current path. The second division $Is_2$, will flow from terminal 3 to terminal 4 by way of the second path composed of the wire 13, conductor layer 15, and wire 14. As the second division $Is_2$ flows through the conductor layer 15 around the main working region of the Hall-effect device 1, the magnetic field H will be generated which, according to the Ampere rule, is oriented in the direction indicated by the broken-line arrows in FIG. 8. This direction of the magnetic field is perpendicular to the direction of the control current Ic in the semiconductor region 28, so that the Hall voltage will be generated between the semiconductor regions 26 and 27, hence between the electrodes 21 and 22, and hence between the lead terminals 8 and 9. The Hall voltage is proportional to the strength of the magnetic field H, which in turn is proportional to the magnitude of the current Is, so that this current is detectable from the Hall voltage.

The advantages gained by the above described embodiment of the invention may be summarized as follows:

1. The current Is is not directly detected but in terms of its division $Is_2$ directed through the conductor layer 15 on the semiconductor substrate 23. Therefore, if the ratio of $R_1$ to $R_2$ is set at one to nine, for instance, then the current $Is_2$ actually flowing through the conductor layer 15 can be as small as 10 amperes when the current Is to be detected is 100 amperes.

2. The wire 12 providing the first current path, and the wires 13 and 14 and the conductor layer 15 providing the second current path, are both enclosed in one and the same plastic package 18. The temperature difference between the two current paths is thus reduced to a minimum, as are variations in the relative magnitudes of the currents $Is_1$ and $Is_2$ due to the temperature difference.

3. The three wires 12, 13 and 14 used for formation of the two current paths are of the same material and so have the same rate of change in resistance due to the ambient temperature. Consequently, the current Is is divisible at an unvarying rate, resulting in highly accurate current detection.

4. Directly overlying the insulating layers 32 on the surface of the semiconductor substrate 23, the conductor layer 15 for carrying the current division $Is_2$ is situated as close as practical to the Hall-effect device 1 formed in the substrate, for enhancement of its detection sensitivity.

5. As the conductor layer 15 surrounds some ninety-five percent of the periphery of the Hall-effect device 1 in the embodiment above, the magnetic lines of force will act on the semiconductor region 28 from all of its four sides, giving another cause for enhanced sensitivity.

6. All but parts of the terminals 3, 4 and 6–11 of the current detector is encapsulated for greater structural stability and operational reliability.

7. The Hall-effect device 1 is sufficiently electrically isolated from the baseplate 2 by the insulating plate 16.

8. Noise due to external magnetic and electric fields is eliminated by the shielding layer 17.

9. The baseplate 2 and the terminals 3, 4 and 6–11 are inexpensively fabricated from common sheet-metal punchings.

Figure 9:
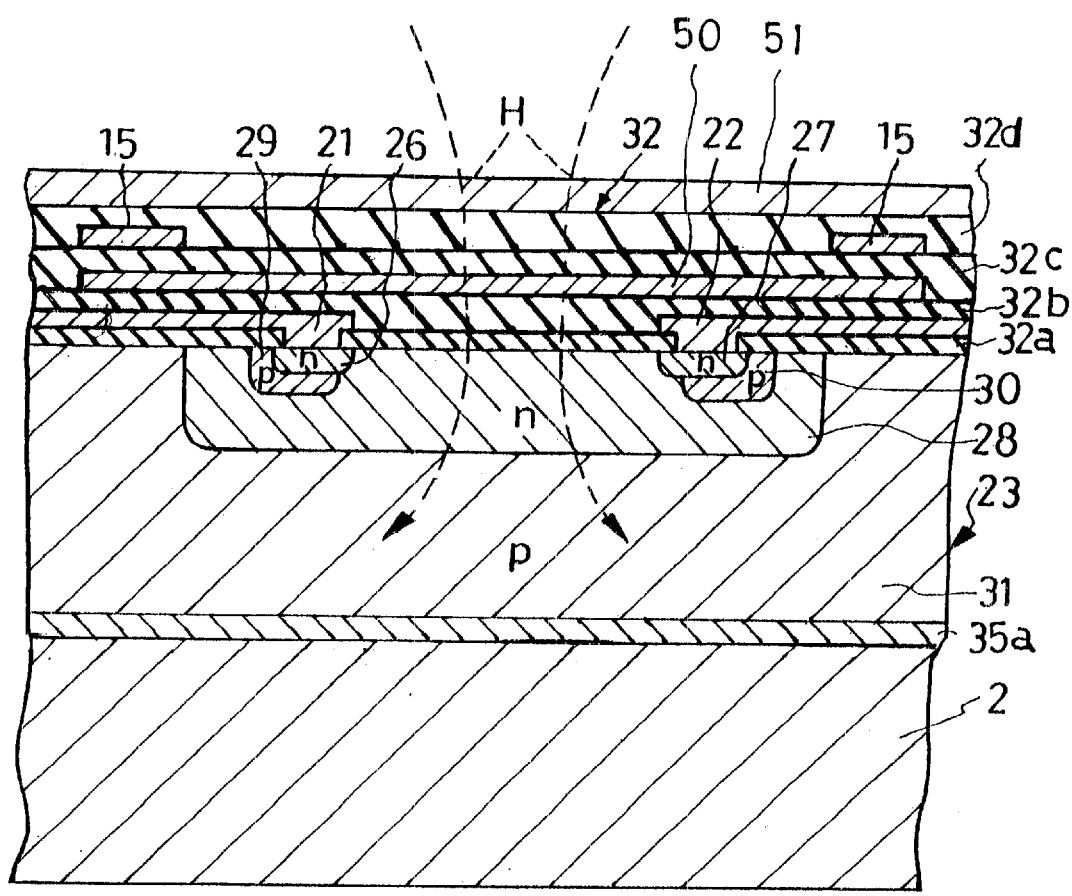
FIG. 9 is a view somewhat similar to FIG. 8 but showing an alternative embodiment of the invention.

FIG. 9 shows, in a view similar to FIG. 8, a second preferred form of current detector according to the invention. As will be understood from a comparison of FIGS. 8 and 9, this second form differs from the first in the following points, the other details of construction being alike in both forms:

1. The insulating plate 16, shielding layer 17, metal layer 33, insulating adhesive layer 34 and conductive bonding layer 35 of the first current detector are absent from the second.

2. The baseplate 2 is bonded directly to the underside of the semiconductor substrate 23, as of gallium arsenide, via a layer 35a of a conductive bonding agent such as silver.

3. A shielding layer 50, magnetic collector 51, and two additional insulating layers 32c and 32d are formed on the top of the semiconductor substrate 23.

Made from molybdenum or like conductive material to a thickness of 0.1 micrometer, as by vapor deposition, cathode sputtering, or plating, the shielding layer 50 overlies the second insulating layer 32b so as to cover, as seen from above in FIG. 9, the semiconductor region 28 and is electrically connected to the electrode 22 to be grounded.

Of the two additional insulating layers 32c and 32d newly introduced in this second embodiment, the insulating layer 32c is formed as by vapor deposition or sputtering over the second insulating layer 32b so as to thoroughly cover the shielding layer 50 preformed thereon.

The conductor layer 15 for carrying the second current division $Is_2$, set forth with reference to FIG. 1, is formed on the third insulating layer 32c in this second embodiment, instead of on the second insulating layer 32b as in FIG. 8, and thus electrically disconnected from the shielding layer 50. Preferably, the conductor layer 15 is fabricated from gold by plating, vapor deposition, or sputtering to a thickness of from about five to thirteen micrometers. The fourth insulating layer 32d is formed on the third insulating layer 21c following the formation of the conductor layer 15 thereon.

Overlying the fourth insulating layer 32d is the magnetic collector 51 which is of magnetic material in sheet form that is higher in magnetic permeability than air, examples being ferrite, iron, and nickel. The magnetic collector 51 is attached to the fourth insulating layer 32d, which is of a synthetic adhesive, so as to cover at least all of the semiconductor region 28 as seen from above in FIG. 9. Alternatively, however, the magnetic collector could be a film of magnetic material formed on the insulating layer 32d as by vapor deposition or coating.

This second current detector possesses all but the seventh and eighth of the nine advantages set forth above in conjunction with the first disclosed device. Additional advantages, unique to this second form, are:

1. Covering the main working parts of the Hall-effect device, including the semiconductor region 28, the shielding layer 50 restricts undesired voltage fluctuations between the electrodes, 21 and 22 due to voltage changes of the conductor layer 15, as well as other noise due to external electric and magnetic fields.

2. The baseplate 2 and conductive adhesive layer 35a coact to shield the underside of the Hall-effect device against induction noise. Sandwiched between these layers and the shielding layer 50, the device is shielded to a maximum possible degree.

3. The shielding layer 50 is itself sandwiched between the insulating films 32b and 32c upon the semiconductor substrate 23, effectively shielding the device without significantly increasing its size.

4. The magnetic collector 51 makes it possible for the magnetic flux, generated by current flow through the conductor layer 15, to be favorably directed to the semiconductor region 28, realizing higher sensitivity in current detection by the Hall-effect device.

Despite the foregoing detailed disclosure, it is not desired that the present invention be limited by the exact showings of the drawings or by the description thereof. The following is a brief list of possible modifications, alterations and adaptations of the illustrated embodiments which are all believed to fall within the scope of the invention:

1. The semiconductor substrate 23 could be fabricated from semiconductors such as 3–5 group compounds other than silicon or gallium arsenide. Although the resulting substrate would be more susceptible to external magnetic fields or induction noise, the shielding layers 17 and 51 would more than amply offset this shortcoming.

2. The insulating plate 16 and shielding layer 17 could be omitted from the first embodiment, with the Hall-effect device 1 formed directly on the baseplate 2.

3. A Hall-voltage amplifier could be built into the semiconductor substrate 23.

4. Two or more Hall-effect devices could be formed in one and the same semiconductor substrate 23, thereby conjointly detecting the current with higher sensitivity.

What is claimed is:

1. A current detector for detecting or measuring an electric current, comprising:

(a) a Hall-effect device for generating a voltage proportional to magnetic field strength;

(b) a first and a second current path terminal for the flow of a current to be detected or measured;

(c) first conductor means connected between the first and the second current path terminal for providing a first current path therebetween, the first conductor means having a first resistance value;

(d) second conductor means connected between the first and the second current path terminal for providing a second current path therebetween, and arranged in relation to the Hall-effect device so as to cause the Hall-effect device to generate an output voltage proportional to the strength of a magnetic field due to the current flowing through the second conductor means, the second conductor means having a second resistance value; and (e) an enclosure of electrically insulating material closely enveloping the first and the second conductor means.

2. The current detector of claim 1 wherein the enclosure further closely envelops the Hall-effect device for holding the Hall-effect device in pre-assigned positional relationship to the first and the second conductor means.

3. The current detector of claim 1 wherein the enclosure further closely envelops the first and the second current path terminal for holding the first and the second current path terminal in preassigned positional relationship to the first and the second conductor means.

4. The current detector of claim 1 wherein the Hall-effect device is formed in a semiconductor substrate having a main working region where a voltage is generated in response to a magnetic field due to the current flowing through the second conductor means, and wherein the second conductor means has a conductor formed on the semiconductor substrate via an insulating layer so as to extend around the main working region of the Hall-effect device.

5. The current detector of claim 4 wherein the conductor of the second conductor means surrounds at least three quarters of a periphery of the main working region of the Hall-effect device.

6. The current detector of claim 4 wherein the second conductor means further comprises:

(a) a second conductor connecting the first current path terminal to the first recited conductor of the second conductor means; and (b) a third conductor connecting the first conductor to the second current path terminal;

(c) the second and the third conductor being of the same material as the first conductor means.

7. The current detector of claim 1 further comprising a metal-made baseplate supporting the Hall-effect device, the baseplate being cut from the same sheet metal punching as are the first and the second current path terminals and terminals connected to the Hall-effect device.

8. The current detector of claim 7 further comprising an insulating layer disposed between the Hall-effect device and the baseplate.

9. The current detector of claim 8 further comprising a shielding layer disposed between the Hall-effect device and the insulating layer.

10. The current detector of claim 7 wherein the baseplate is formed in one piece with a grounding terminal.

11. The current detector of claim 4 further comprising a shielding layer interposed between the semiconductor substrate and the conductor of the second conductor means.

12. The current detector of claim 4 further comprising a magnetic collector formed over the conductor of the second conductor means.

* * * * *

UNITED STATES PATENT AND TRADEMARK OFFICE
CERTIFICATE OF CORRECTION

PATENT NO. : 6,462,531 B1
DATED : October 8, 2002
INVENTOR(S) : Koji Ohtsuka

It is certified that error appears in the above-identified patent and that said Letters Patent is hereby corrected as shown below:

Column 3,
Line 35, delete "this." and insert -- this -- therefor;

Column 5,
Line 39, delete "detectedor", and insert -- detected or -- therefor;

Column 6,
Line 23, delete "$IS_1$," and insert -- $IS_1$ -- therefor;
Line 25, delete "$IS_2$," and insert -- $IS_2$ -- therefor.

Signed and Sealed this

Sixteenth Day of March, 2004

JON W. DUDAS
*Acting Director of the United States Patent and Trademark Office*